US012684832B2

(12) United States Patent
Guler et al.

(10) Patent No.: US 12,684,832 B2
(45) Date of Patent: Jul. 14, 2026

(54) EPI BARRIER ALIGNED BACKSIDE CONTACT

(71) Applicant: Intel Corporation, Santa Clara, CA (US)

(72) Inventors: Leonard P. Guler, Hillsboro, OR (US); Mohammad Hasan, Aloha, OR (US); Mohit K. Haran, Hillsboro, OR (US); Mauro J. Kobrinsky, Portland, OR (US); Charles H. Wallace, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 311 days.

(21) Appl. No.: 17/561,715

(22) Filed: Dec. 24, 2021

(65) Prior Publication Data

US 2023/0207623 A1 Jun. 29, 2023

(51) Int. Cl.
| | |
|---|---|
| *H01L 29/06* | (2006.01) |
| *H01L 29/423* | (2006.01) |
| *H01L 29/66* | (2006.01) |
| *H01L 29/786* | (2006.01) |
| *H10D 30/01* | (2025.01) |

(Continued)

(52) U.S. Cl.
CPC ....... *H10D 62/121* (2025.01); *H10D 30/0321* (2025.01); *H10D 30/6713* (2025.01); *H10D 30/6735* (2025.01); *H10D 30/6745* (2025.01); *H10D 30/6757* (2025.01)

(58) Field of Classification Search
CPC ............. H10D 62/121; H10D 30/0321; H10D 30/6713; H10D 30/6735; H10D 30/6745;

H10D 30/6757; H10D 64/252; H10D 84/0188; H10D 84/903; H10D 84/144; H10D 84/201; H10D 84/0109; H10D 1/045; H02K 15/027; A61K 40/4218;

(Continued)

(56) References Cited

U.S. PATENT DOCUMENTS

| | | | |
|---|---|---|---|
| 11,195,930 B1 * | 12/2021 | Chen ...................... | H10D 64/62 |
| 2008/0054313 A1 | 3/2008 | Dyer | |

(Continued)

FOREIGN PATENT DOCUMENTS

| | | |
|---|---|---|
| WO | WO 2017-052649 | 3/2017 |

OTHER PUBLICATIONS

International Search Report and Written Opinion for International Patent Application No. PCT/US2022/050877, mailed Mar. 22, 2023, 11 pgs.

(Continued)

*Primary Examiner* — Tong-Ho Kim
(74) *Attorney, Agent, or Firm* — Schwabe, Williamson & Wyatt, P.C.

(57) ABSTRACT

Embodiments disclosed herein include semiconductor devices and methods of forming such devices. In an embodiment, a semiconductor device comprises a vertical stack of semiconductor channels, a source on a first side of the vertical stack of semiconductor channels, and a drain on a second side of the vertical stack of semiconductor channels, In an embodiment, a metal is below the source and in direct contact with the source, where a centerline of the metal is substantially aligned with a centerline of the source.

18 Claims, 14 Drawing Sheets

(51) Int. Cl.
    *H10D 30/67*       (2025.01)
    *H10D 62/10*       (2025.01)

(58) Field of Classification Search
    CPC ............. H10H 20/826; H10H 20/0165; H10H
          20/8314; A23B 2/783; B82Y 10/00; H10F
                                          10/18
    USPC .......................................................... 257/14
    See application file for complete search history.

(56)                 References Cited

U.S. PATENT DOCUMENTS

| | | |
|---|---|---|
| 2014/0199845 A1 | 7/2014 | Choi et al. |
| 2016/0056249 A1 | 2/2016 | Keleemeler et al. |
| 2018/0219075 A1* | 8/2018 | Morrow ............... H10D 84/038 |
| 2021/0375664 A1* | 12/2021 | Chang ............... H01L 21/31116 |
| 2021/0375857 A1* | 12/2021 | Huang ................. H10D 30/014 |
| 2022/0037193 A1* | 2/2022 | Yu ...................... H10D 30/6713 |
| 2023/0010717 A1* | 1/2023 | Wang ................... H10D 30/014 |

OTHER PUBLICATIONS

International Preliminary Report on Patentability for International
Patent Application No. PCT/US2022/050877, mailed Jul. 4, 2024,
8 pgs.

* cited by examiner

EPI BARRIER ALIGNED BACKSIDE CONTACT

TECHNICAL FIELD

Embodiments of the disclosure are in the field of semiconductor structures and processing and, in particular, to nanoribbon structures with an aligned backside contact.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
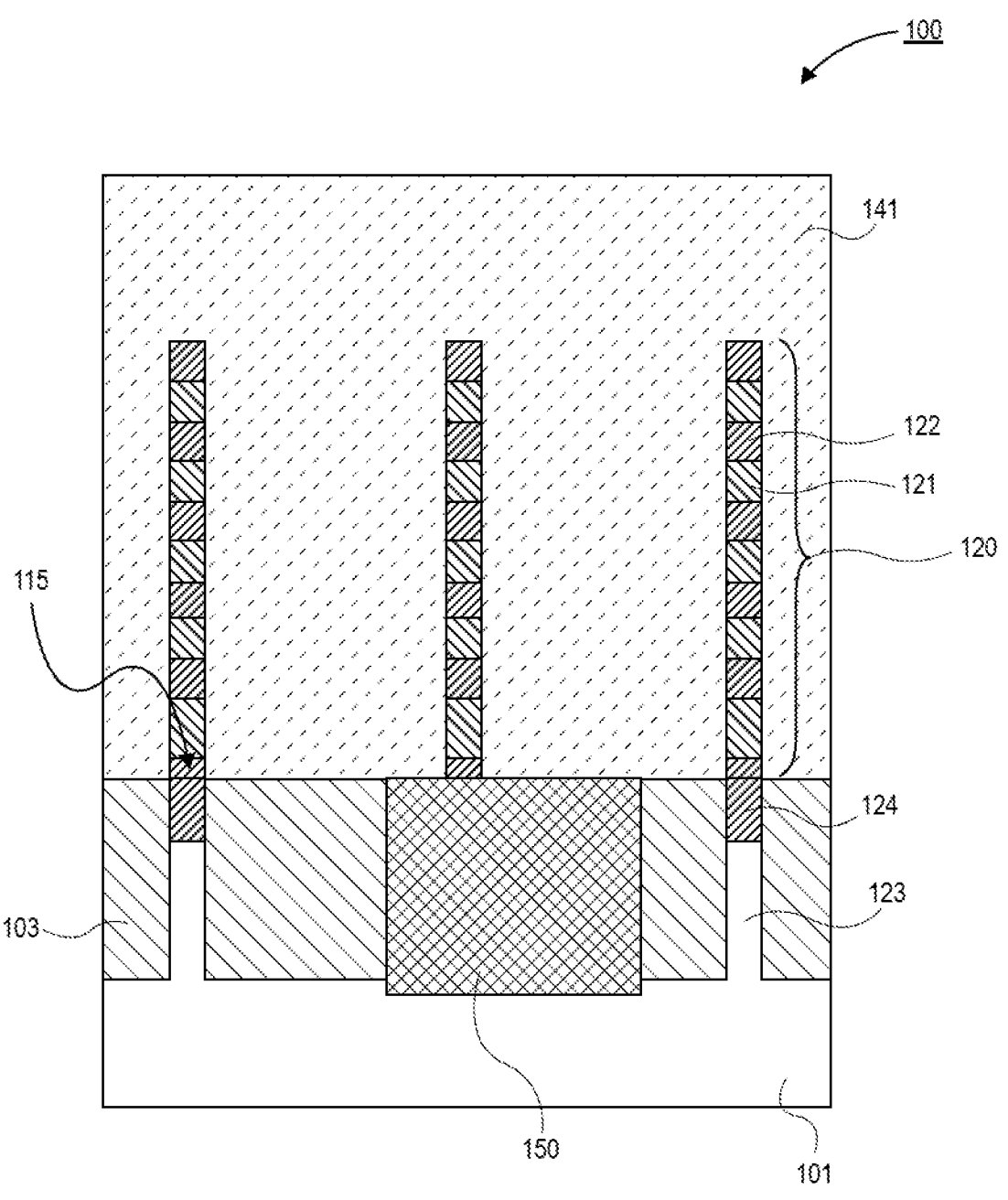
FIG. 1A is a front view illustration of a semiconductor device with the source and drain regions recessed and a backside contact template formed below the source region, in accordance with an embodiment.

Embodiments described herein comprise nanoribbon structures with an aligned backside contact. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

To provide context, a pair of front side views of a semiconductor structure at various points of manufacture are shown to illustrate some limiting aspects of existing process flows. Particularly, the backside contact template is formed without any self-aligning features. This results in the backside metal contact being misaligned with the source or drain region. This misalignment limits the amount of scaling since the misaligned backside metal contact may potentially short to a neighboring source or drain region. As such, the existing process flows that use backside metal contacts are limited in how much the pitch between fins can be reduced.

Referring now to FIG. 1A, a front view of a semiconductor structure 100 is shown, in accordance with an embodiment. In the illustrated view, the gate spacer 141 and the fin 120 are set back (i.e., into the page) from the subfin 123 and the bottom sacrificial layer 124. That is, a ledge 115 over the bottom sacrificial layer 124 is provided. Additionally, the isolation layer 103 and the backside contact template 150 are provided in front of the fins 120. Such an architecture will result from the patterning of the source/drain regions of the fins 120 after the gate structure is provided across the fins. Accordingly, the fins 120 may only be present within the gate structure.

The fins 120 may comprise alternating layers of channel layers 121 and sacrificial layers 122. While five channel layers 121 are shown in FIG. 1A, it is to be appreciated that any number of channel layers 121 may be used. In an embodiment, the fins 120 are disposed over a subfin 123. The subfins 123 may be coupled to an underlying substrate 101. The isolation layer 103 may surround the subfins 123. In some instances, the isolation layer 103 may be referred to as a shallow trench isolation (STI) layer 103.

As shown, the backside contact template 150 is provided through the isolation layer 103. The backside contact template 150 is in front of the center fin 120. That is, the backside contact template 150 is provided under the source/drain region. The backside contact template 150 may be formed with a patterning process. However, the patterning process does not have any self-aligning features. Accordingly, the backside contact template 150 may be off-center of the center fin 120.

Figure 1B:
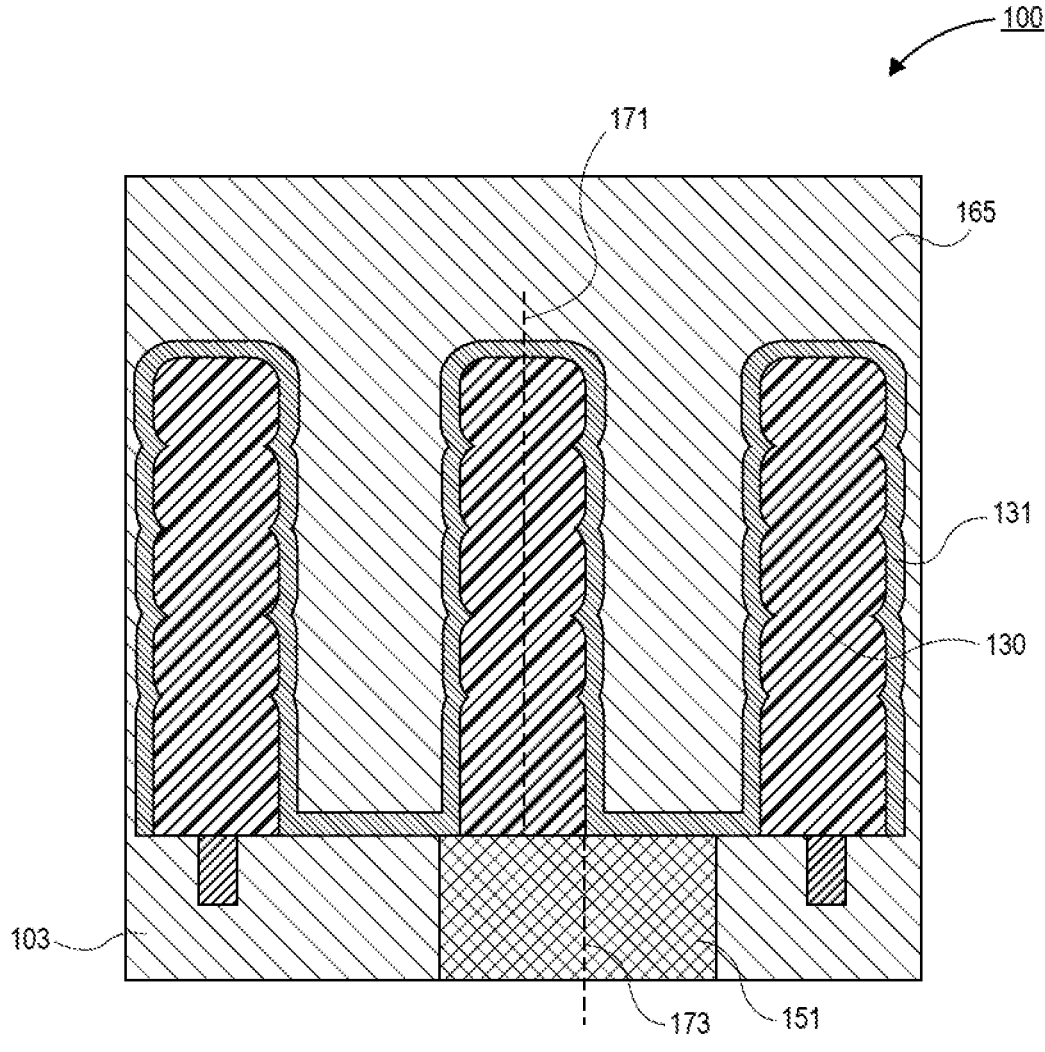
FIG. 1B is a front view illustration of a semiconductor device with a source region that is contacted with a backside metal contact that is misaligned with the source region, in accordance with an embodiment.

Referring now to FIG. 1B, a front view illustration of the semiconductor structure 100 after source/drains 130 are formed and the backside contact template 150 is replaced with a backside metal 151 is shown. The source/drains 130 may have a dielectric liner 131. An insulating layer 165 may surround the source/drains 130. However, as depicted in FIG. 1B, a centerline 171 of the center source/drain 130 is offset from a centerline 173 of the backside metal 151. Accordingly, the spacing between source/drains 130 needs to be increased in order to account for the misalignment, and reduce the chance of shorting to a neighboring source/drain 130.

Accordingly, embodiments disclosed herein include backside metal contacts that are self-aligned with the overlying source/drain region. Particularly, self-aligned structures in this context may refer to two or more structures that are formed using the same structural features. For example, as will be disclosed in greater detail below, an epitaxial barrier layer is patterned over the source/drain regions. The epitaxial barrier is used as an etch mask in order to form an opening into which the backside contact template is deposited. Additionally, the epitaxial barrier is used to confine the growth of the epitaxially grown source/drains. Since the epitaxial barrier is used for the formation of both the backside contact template and the source/drains, the backside contact template will be self-aligned with the overlying source/drain. For example, a centerline of the source/drain may be substantially coincident with a centerline of the backside contact template.

Providing self-aligned features enables device scaling. Particularly, the pitch between fins may be reduced in embodiments disclosed herein. The pitch reduction may be made possible since the backside metal contact (which replaces the backside contact template) will not significantly extend past an edge of the overlying source/drain. That is, there is no possibility of shorting the backside metal contact to a neighboring source/drain.

Referring now to FIGS. 2A-2E, a series of front view illustrations depicting a process for fabricating a semiconductor device 200 is shown, in accordance with an embodiment. In the embodiments shown in FIGS. 2A-2E, a self-aligned process to form a backside metal contact to a source/drain region is shown.

Figure 2A:
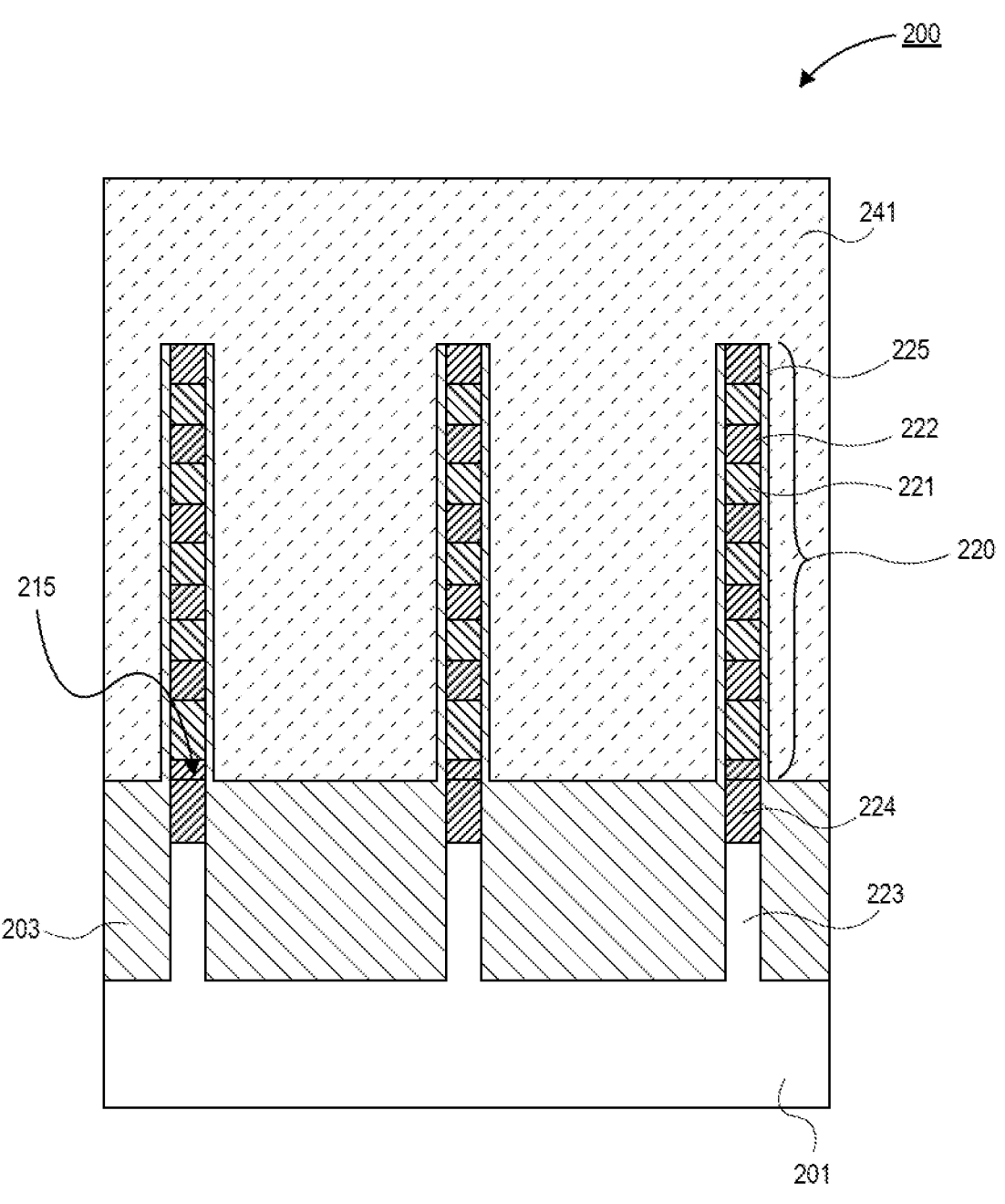
FIG. 2A is a front view illustration of a semiconductor device with the source and drain regions recessed, in accordance with an embodiment.

Referring now to FIG. 2A, a front view illustration of a semiconductor device 200 is shown, in accordance with an embodiment. It is to be appreciated that the illustration in FIG. 2A is not a pure cross-sectional illustration. Instead a pair of planes are depicted in FIG. 2A. The isolation layer 203, the bottom sacrificial layer 224, and the subfins 223 are in a first plane, and the fins 220 and the gate spacer 241 are in a second plane behind the first plane. For example, a ledge 215 may be provided between a front surface of the fins 220 and a front surface of the isolation layer 203.

In an embodiment, the semiconductor device 200 may be provided over an underlying substrate 201. The underlying substrate 201 may be a semiconductor substrate. The underlying substrate 201 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, a plurality of fins 220 may extend up from the substrate 201. The fins 220 may be coupled to the substrate 201 by a bottom sacrificial layer 224 and a subfin 223. The subfin 223 may comprise the same material as the substrate 201. In an embodiment, the fins 220 may comprise alternating semiconductor channel layers 221 and sacrificial layers 222. In an embodiment, sacrificial layers 222 may be any material that can be selectively etched with respect to semiconductor channel layers 221. Semiconductor channel layers 221 and sacrificial layers 222 may each be a material such as, but not limited to, silicon, germanium, SiGe, GaAs, InSb, GaP, GaSb, InAlAs, InGaAs, GaSbP, GaAsSb, and InP. In a specific embodiment, semiconductor channel layers 221 are silicon and sacrificial layers 222 are SiGe. In another specific embodiment, semiconductor channel layers 221 are germanium, and sacrificial layers 222 are SiGe.

In an embodiment, the fins 220 may be fabricated with any suitable process. Fins 220 may be formed by known methods, such as forming alternating layers of semiconductor channel material and sacrificial material over the substrate 201, and then etching the layers to form a fin-type structure e.g., with a mask and plasma etch process. After the fins 220 are formed, the isolation layer 203 may be disposed over the substrate 201 and recessed below the alternating layers 221 and 222. The isolation layer 203 may comprise an oxide or the like. In some instances the isolation layer 203 may be referred to as an STI. An insulating layer 225 may also be formed over the fins 220. A gate structure may then be disposed across the fins 220. The gate spacer 241 of the gate structure is shown in FIG. 2A. After the gate structure is formed, the portion of the fins 220 outside of the gate structure are recessed. For example, ledge 215 is provided between the face of the fins 220 and the face of the bottom sacrificial layer 224.

Figure 2B:
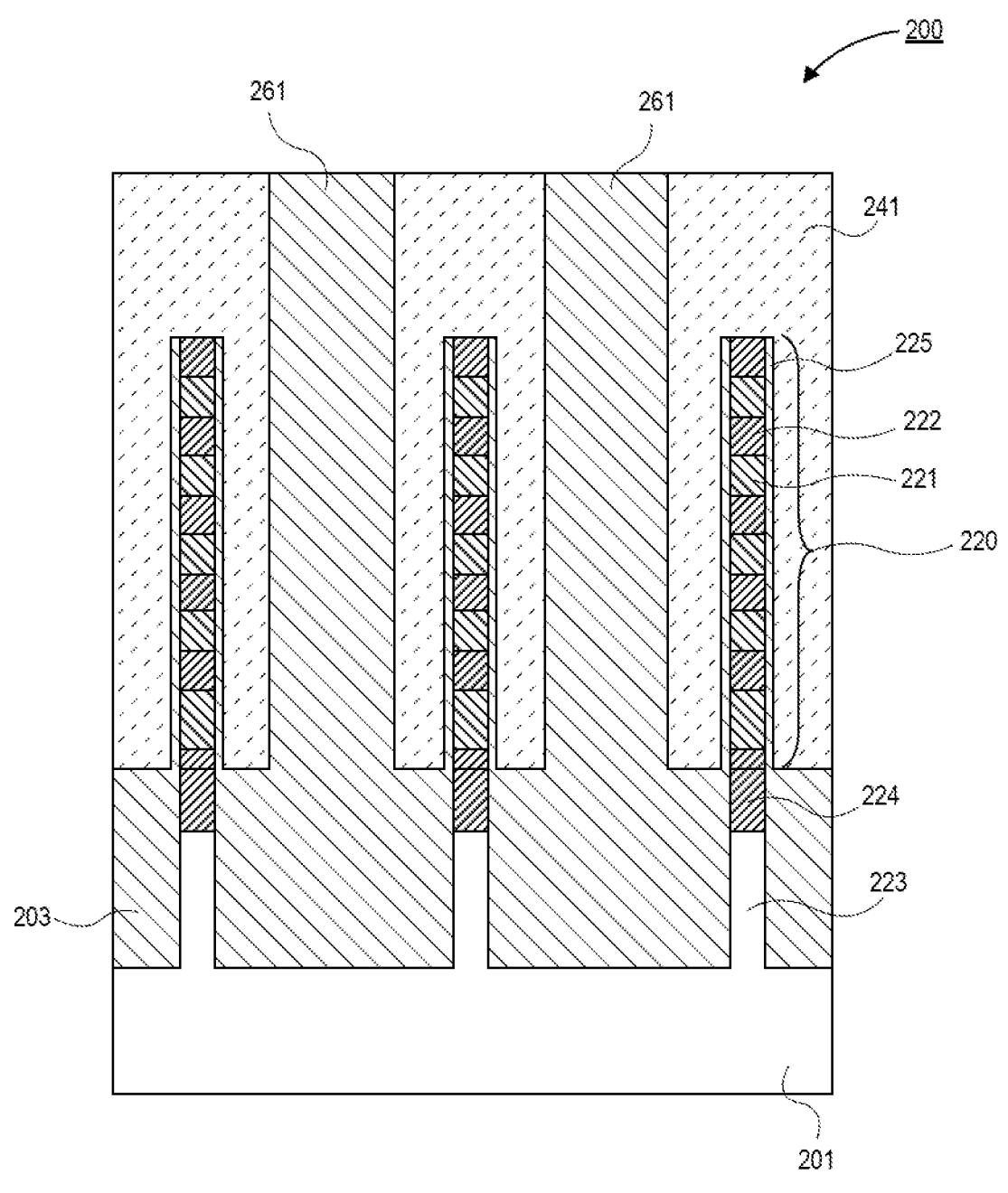
FIG. 2B is a front view illustration of the semiconductor device with an epitaxial barrier layer formed around the source region, in accordance with an embodiment.

Referring now to FIG. 2B, a front view illustration of the semiconductor device 200 is shown, in accordance with an embodiment. As shown, epitaxial barrier layers 261 may be formed. The epitaxial barrier layers 261 may be provided between the fins 220. In an embodiment, the epitaxial barrier layers 261 are substantially aligned with the fins 220. That is, the fins 220 may be at a centerline of the opening between a pair of epitaxial barrier layers 261. However, it is to be appreciated that manufacturing tolerances may result in the epitaxial barrier layers 261 being somewhat misaligned with the fins 220. However, the alignment will be considered sufficient so long as a single fin 220 is provided in the space between neighboring epitaxial barrier layers 261. As shown, the epitaxial barrier layers 261 may extend up to a top surface of the gate spacer 241. The epitaxial barrier layers 261 may be any suitable material composition. In a particular embodiment, the epitaxial barrier layers 261 comprise an oxide, a nitride, or the like.

Figure 2C:
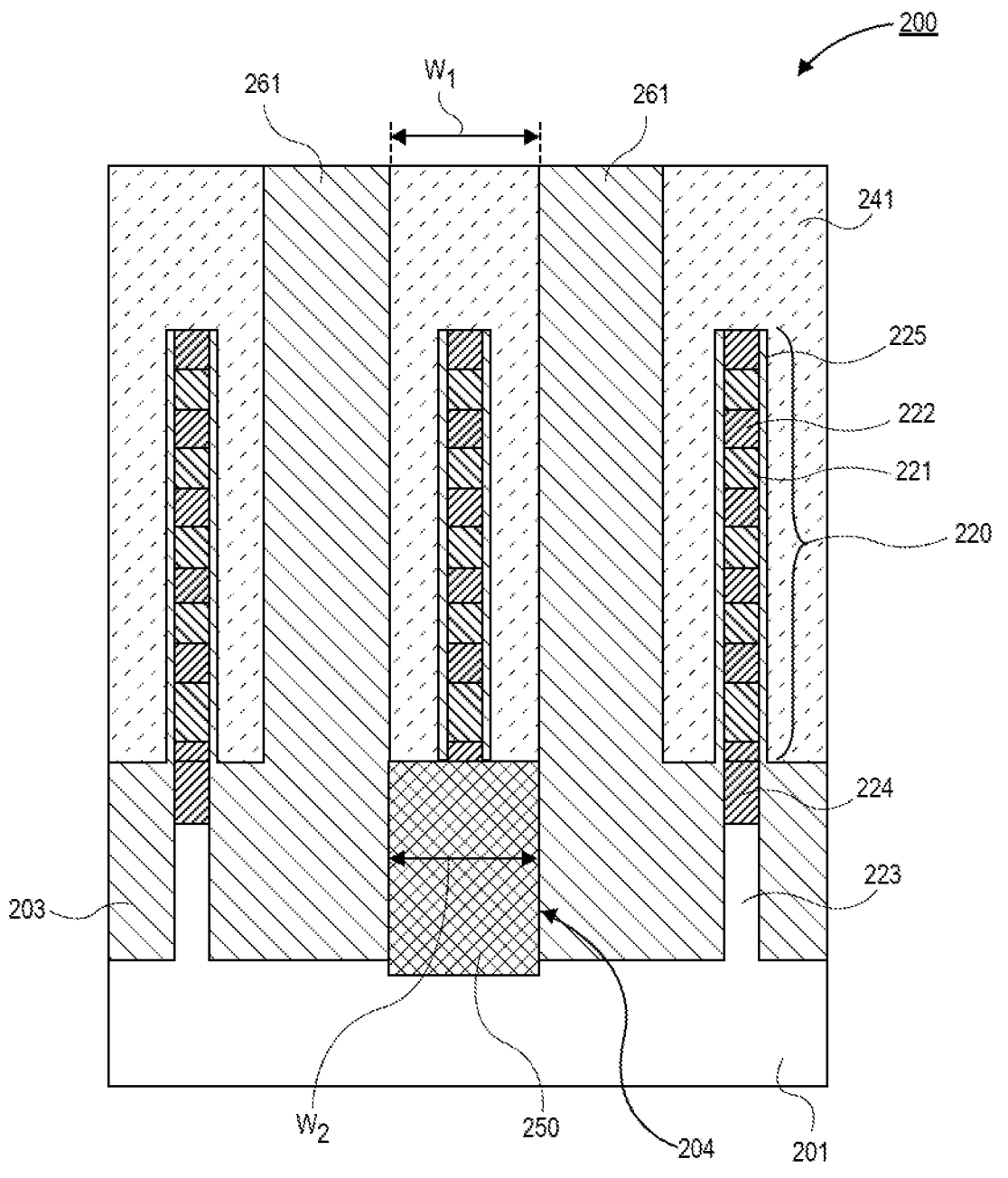
FIG. 2C is a front view illustration of the semiconductor device with a backside contact template disposed between the epitaxial barrier layer, in accordance with an embodiment.

Referring now to FIG. 2C, a front view illustration of the semiconductor device 200 after a backside contact template 250 is formed is shown, in accordance with an embodiment. As shown, the backside contact template 250 is provided in a trench 204 that is formed into the isolation layer 203. In an embodiment, the trench 204 may extend into the substrate 201. The trench 204 may be formed with an etching process, such as a plasma etching process. A mask layer (not shown) may cover openings where no trench 204 is desired. For example, the etching process may be a plasma etching process. As such, a width $W_1$ of the opening between epitaxial barrier layers 261 may be substantially equal to a width $W_2$ of the backside contact template 250. As used here, when two values are referred to as being substantially equal, the values are equal to within 10%. For example, 100 nm is substantially equal to a range of 90 nm-110 nm. However, it is to be appreciated that the etching process may result in the width $W_2$ being slightly larger than the width $W_1$ of the opening. Despite potential differences in the widths $W_1$ and $W_2$, the backside contact template 250 will still remain substantially centered between the epitaxial barrier layers 261. In an embodiment, the backside contact template 250 may be any suitable material that is etch selective to the isolation layer 203. In a particular embodiment, the backside contact template 250 may comprise polysilicon.

Figure 2D:
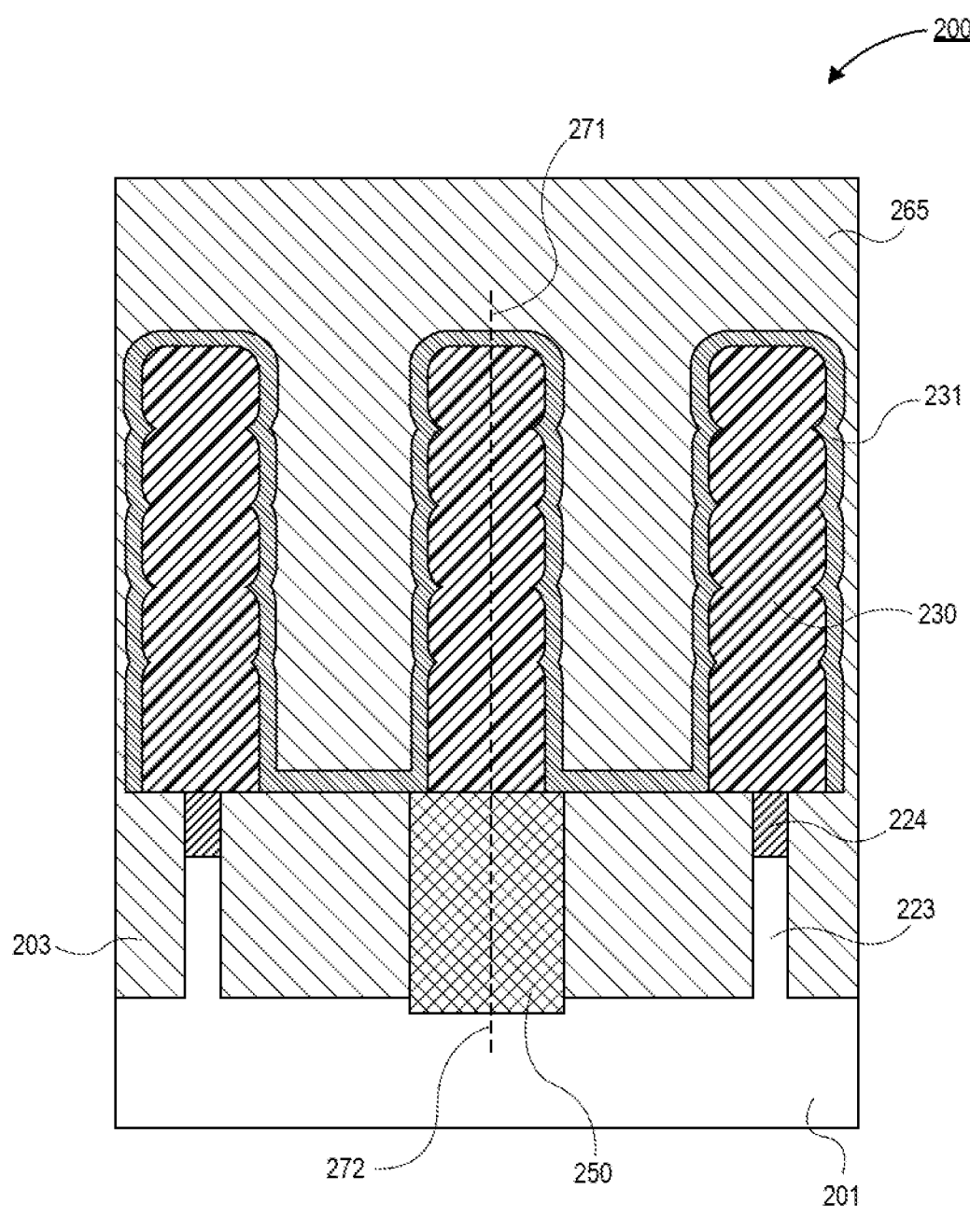
FIG. 2D is a front view illustration of the semiconductor device with a source epitaxially grown in the source region, in accordance with an embodiment.

Referring now to FIG. 2D, a front view illustration of the semiconductor device 200 after source/drains 230 are formed is shown, in accordance with an embodiment. While referred to as source/drains 230, it is to be appreciated that each instance of the source/drains 230 may be either a source or a drain. In an embodiment, the source/drains 230 may be grown with an epitaxial growth process. In some implementations, a silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. However, it is to be appreciated that any suitable source/drain material known to those skilled in the art may be used.

In an embodiment, the source/drains 230 are grown from the fin 220. As the epitaxial growth extends outward, the source/drains 230 run into the epitaxial barrier layers 261. That is, the growth of the source/drains 230 are confined by the epitaxial barrier layers 261. As such, a centerline 271 of the source/drains 230 will be substantially coincident with a centerline 272 of the backside contact template 250. As used herein, substantially coincident may include two centerlines that are within 5 nm of being perfectly coincident. That is, it is to be appreciated that despite the presence of self-aligned features, there still may be some slight amount of misalignment due to material properties and tolerances. The confined growth may result in the sidewalls of the source/drains 230 being scalloped.

In an embodiment, after the source/drains 230 are grown, the epitaxial barrier layers 261 may be removed. A dielectric 231 may then be grown over the sidewalls of the source/drains 230. For example, the dielectric 231 may include, but is not limited to, silicon and nitrogen; silicon, carbon, and nitrogen; or silicon oxygen, and nitrogen. After the dielectric 231 is deposited an insulating layer 265 may be disposed over and around the source/drains 230.

Figure 2E:
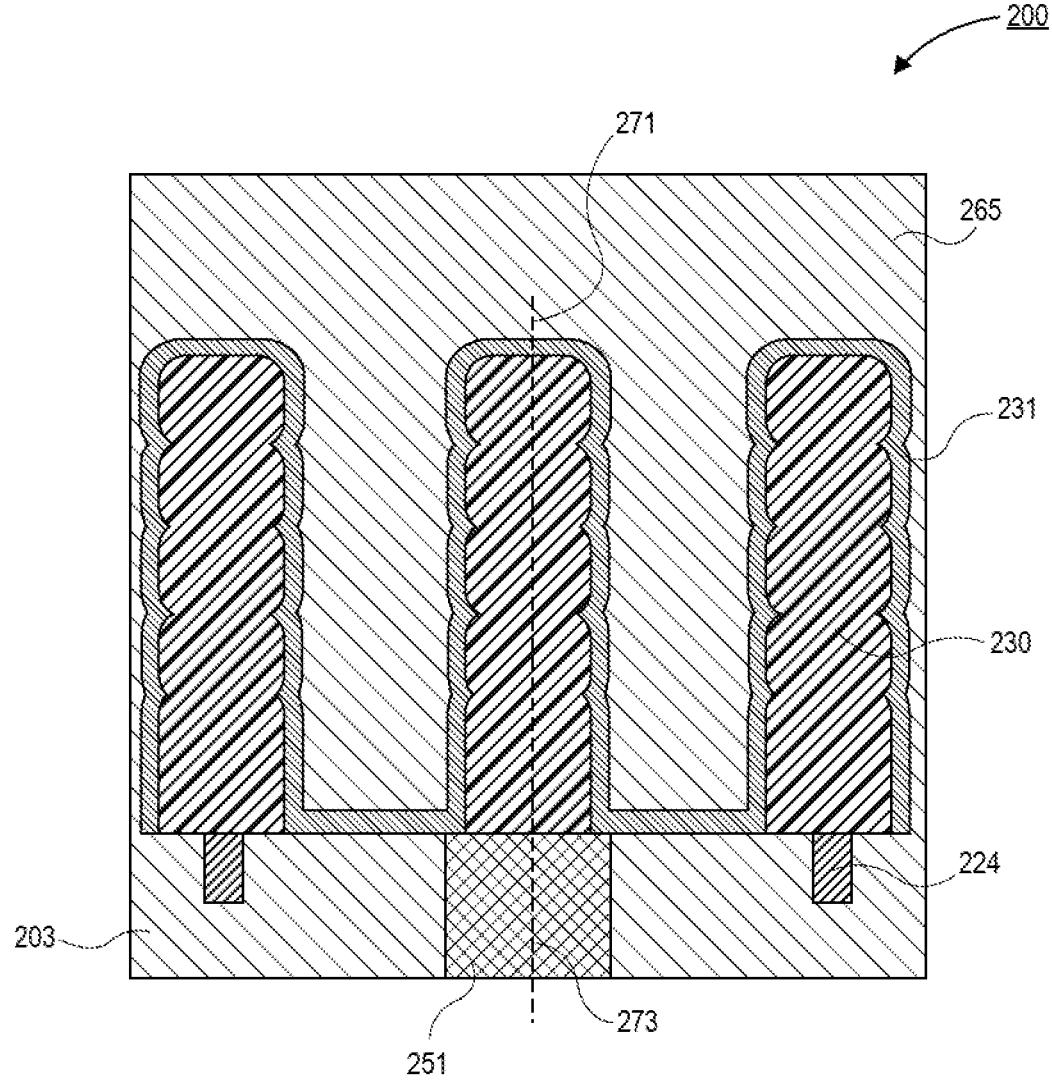
FIG. 2E is a front view illustration of the semiconductor device with a backside metal contact that is centered with the source, in accordance with an embodiment.

Referring now to FIG. 2E, a cross-sectional illustration of the semiconductor device 200 after the backside contact template 250 is replaced with a backside metal contact 251 is shown, in accordance with an embodiment. In an embodiment, the substrate 201 may be removed, with a polishing process. The backside contact template 250 may be removed with an etching process. A backside metal contact 251 may then be deposited in place of the backside contact template 250. In an embodiment, the backside metal contact 251 may comprise any suitable conductive material. In a particular embodiment, the backside metal contact 251 may comprise tungsten or the like.

Since the backside metal contact 251 replaces the backside contact template 250, a centerline 271 of the source/drain 230 is substantially coincident with a centerline 273 of the backside metal contact 251. As such, the backside metal contact 251 is not able to extend over to neighboring source/drains 230. This prevents shorting to the wrong source/drain, and allows for the pitch between fins to be reduced.

Referring now to FIGS. 3A-3E, a series of perspective view illustrations depicting a process for forming backside metal contacts is shown, in accordance with an additional embodiment. The FIGS. 3A-3E more clearly illustrate certain aspects of the process, such as, for example, the gate structure.

Figure 3A:
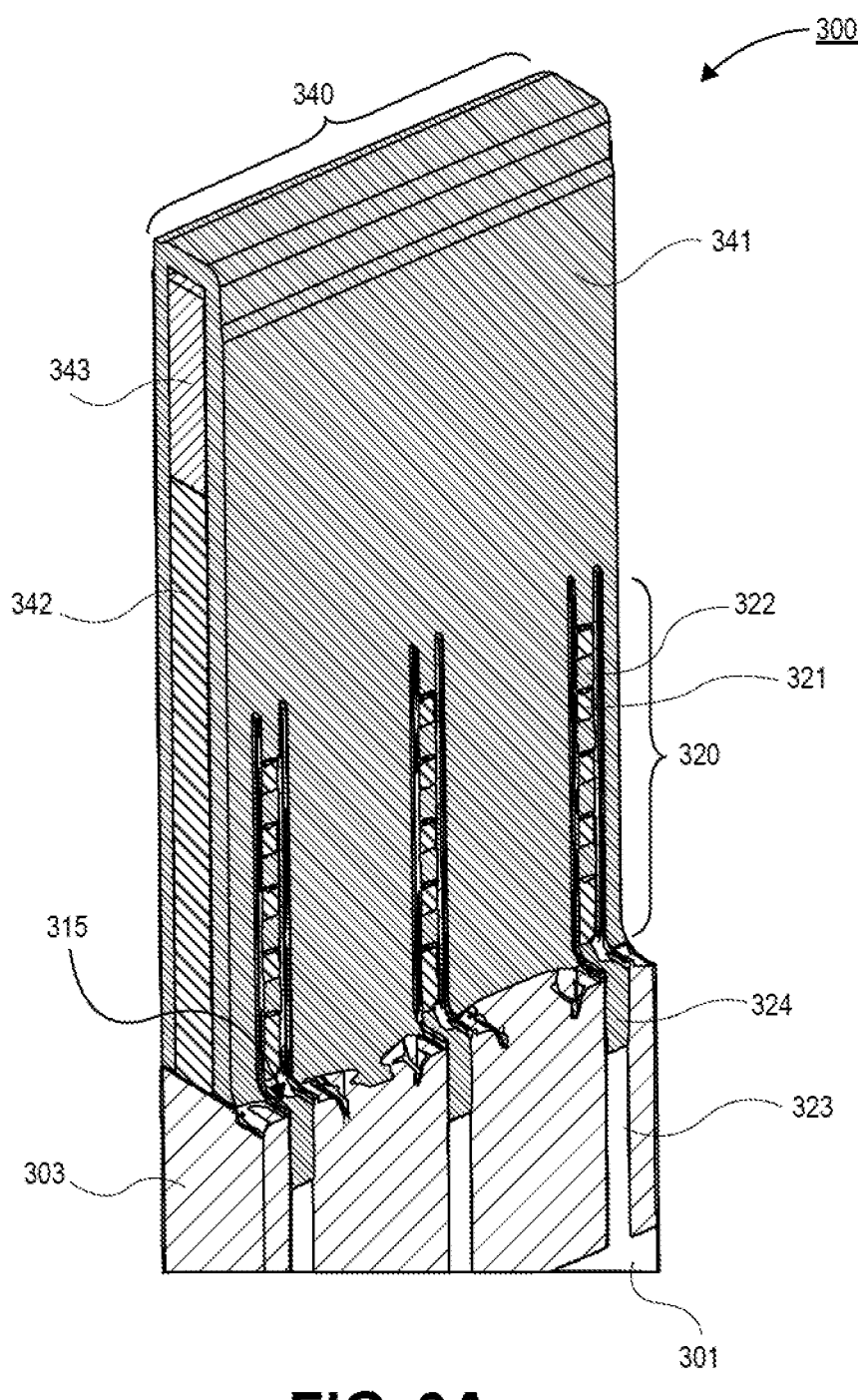
FIG. 3A is a perspective view illustration of a semiconductor device with a gate structure over a fin with the source and drain regions recessed, in accordance with an embodiment.

Referring now to FIG. 3A, a perspective view illustration of a semiconductor device 300 is shown, in accordance with an embodiment. In an embodiment, the semiconductor device 300 comprises a substrate 301, such as a semiconductor substrate. The substrate 301 may be substantially similar to the substrate 201 described in greater detail above. A plurality of subfins 323 may extend up from the substrate 301. The subfins 323 may be surrounded by an isolation layer 303. A bottommost sacrificial layer 324 may be partially etched to form a ledge 315. A fin 320 may extend up from the ledge 315. In an embodiment, the fin 320 comprises alternating sacrificial layers 322 and semiconductor channel layers 321. The sacrificial layers 322 and the semiconductor channels 321 may be substantially similar to sacrificial layers 222 and semiconductor channel layers 221 described in greater detail above. As shown, a gate structure 340 may be provided over and around the fins 320. The gate structure 340 may comprise a gate spacer 341. A sacrificial gate 342 and a mask layer 343 may be provided within the gate spacer 341. The sacrificial gate 342 may comprise polysilicon in some embodiments.

Figure 3B:
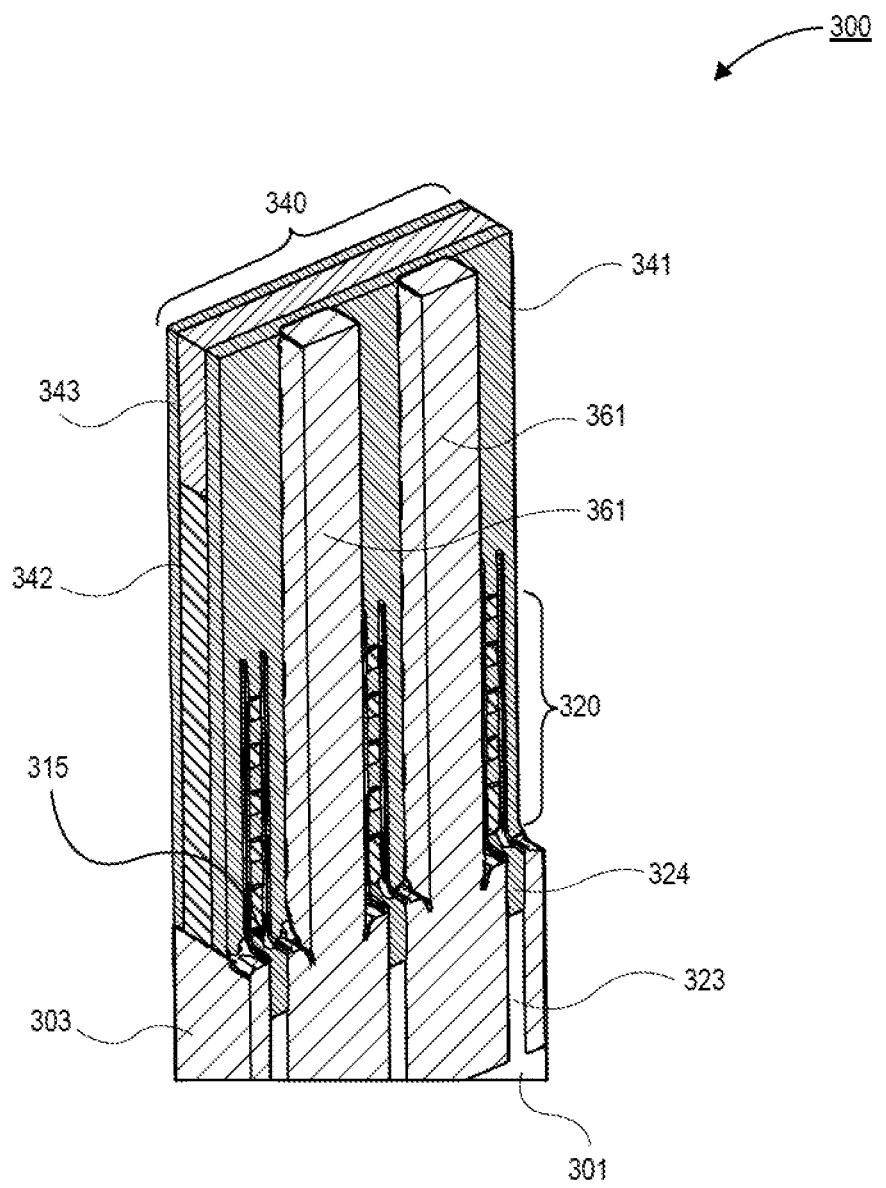
FIG. 3B is a perspective view illustration of the semiconductor device after an epitaxial barrier layer is disposed on the sides of the source region, in accordance with an embodiment.

Referring now to FIG. 3B, a perspective view illustration of the semiconductor device 300 after epitaxial barrier layers 361 are formed is shown, in accordance with an embodiment. As shown, the epitaxial barrier layers 361 extend up from the ledge 315 to the top of the gate structure 340. In an embodiment, the epitaxial barrier layers 361 may be provided so that a fin 320 is provided between them. In a particular embodiment, the center fin is substantially aligned with the opening between the epitaxial barrier layers 361. In an embodiment, the epitaxial barrier layers 361 may be the same material as the isolation layer 303.

Figure 3C:
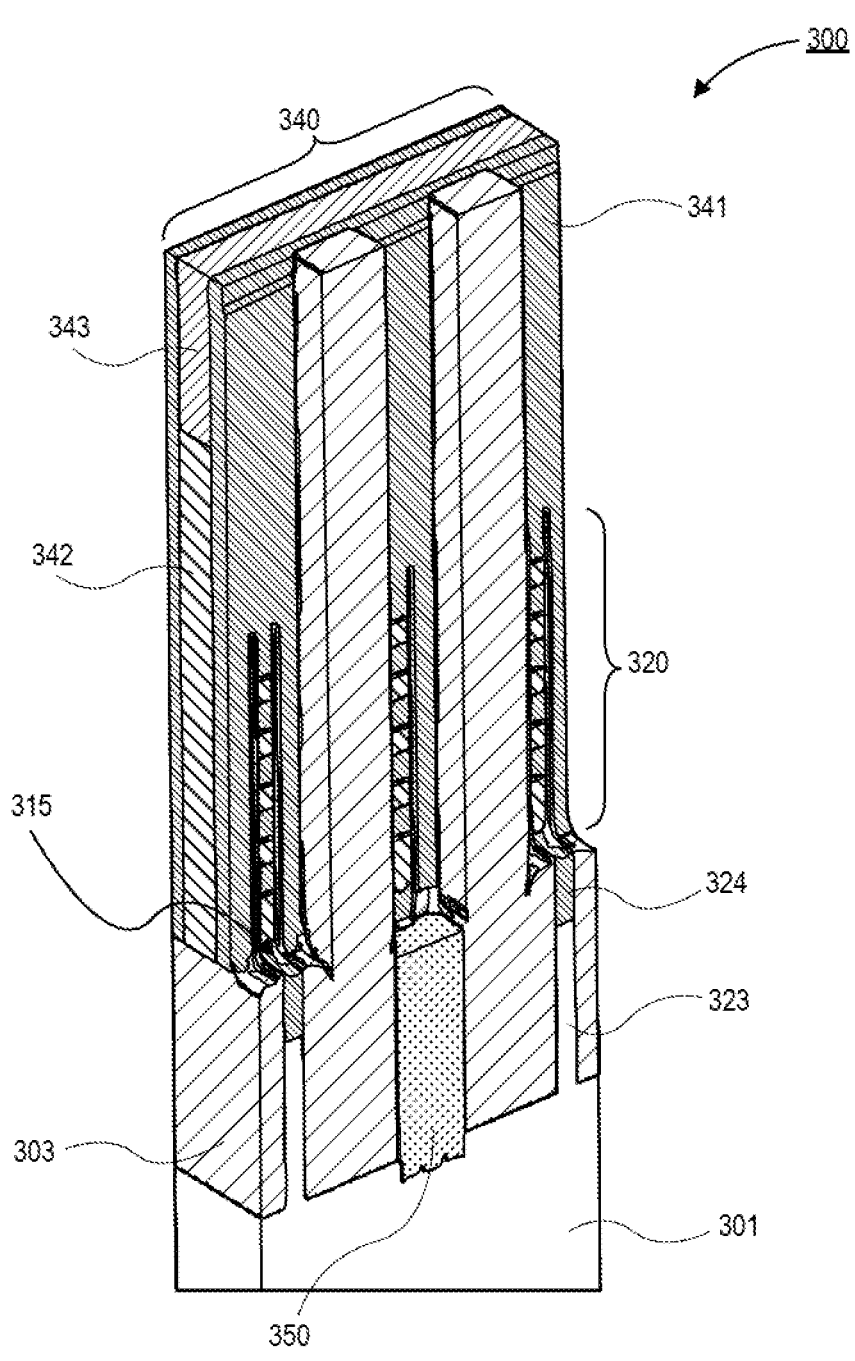
FIG. 3C is a perspective view illustration of the semiconductor device after a backside contact template is disposed between the epitaxial barrier layer, in accordance with an embodiment.

Referring now to FIG. 3C, a perspective view illustration of the semiconductor device 300 after the backside contact template 350 is formed is shown, in accordance with an embodiment. In an embodiment, the backside contact template 350 may be formed by etching through the ledge 315 between the epitaxial barrier layers 361. As such, a centerline of the backside contact template 350 may be substantially aligned with a centerline of the opening between the epitaxial barrier layers 361.

Figure 3D:
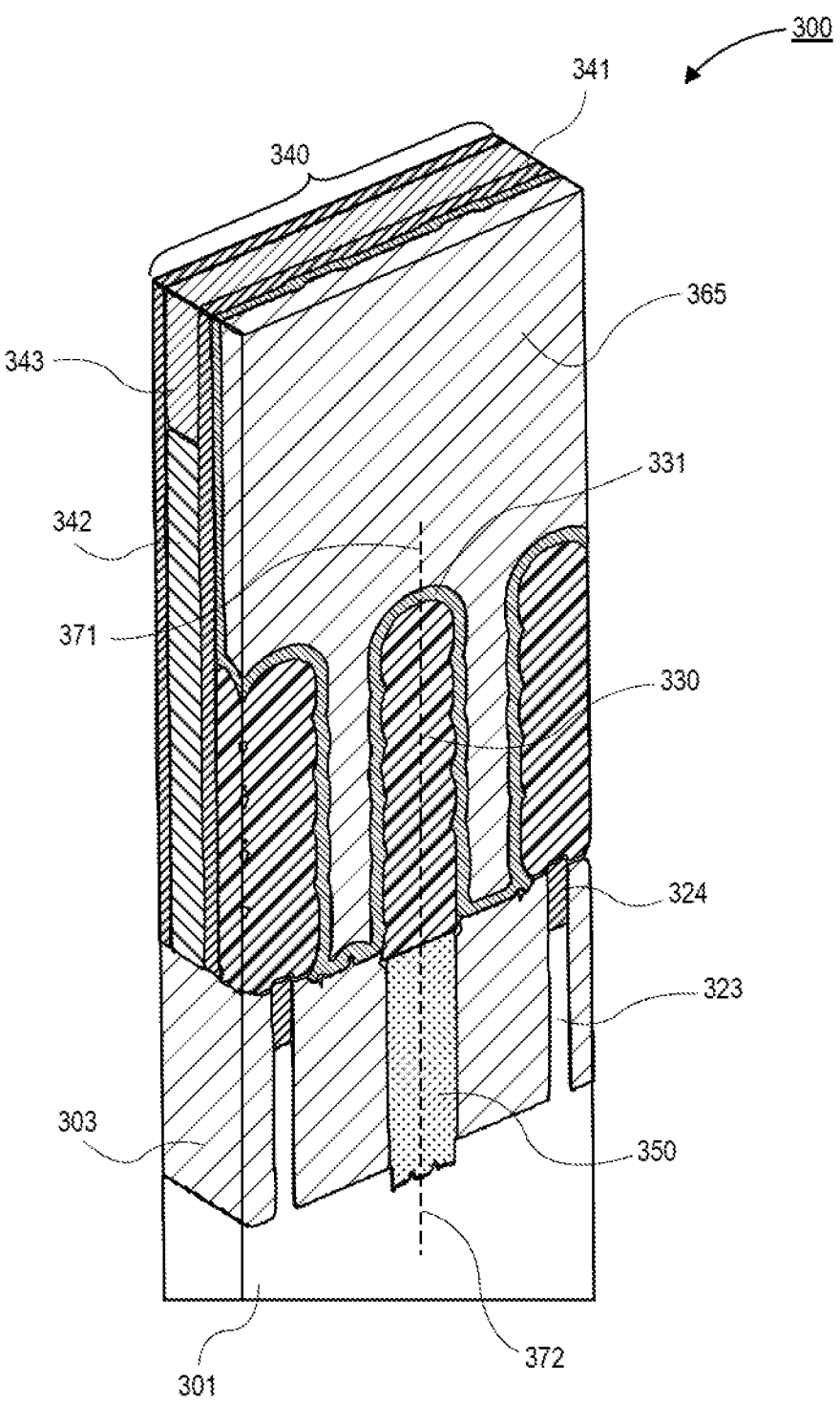
FIG. 3D is a perspective view illustration of the semiconductor device after an epitaxial source is grown over the backside contact template, in accordance with an embodiment.

Referring now to FIG. 3D, a perspective view illustration of the semiconductor device 300 after the source/drains 330 are formed is shown, in accordance with an embodiment. In an embodiment, the source/drains 330 may be epitaxially grown from the fins 320. The growth of the source/drains 330 may be confined by the epitaxial barrier layers 361. As such, a centerline 371 of the source/drains 330 will be substantially coincident with a centerline 372 of the backside contact template 350. After the source/drains 330 are grown, the epitaxial barrier layers 361 may be removed, and a dielectric layer 331 may be provided over the source/drains 330. An insulating layer 365 may then be formed over the dielectric layer 331. The top surface of the insulating layer 365 may be substantially coplanar with a top surface of the gate structure 340.

Figure 3E:
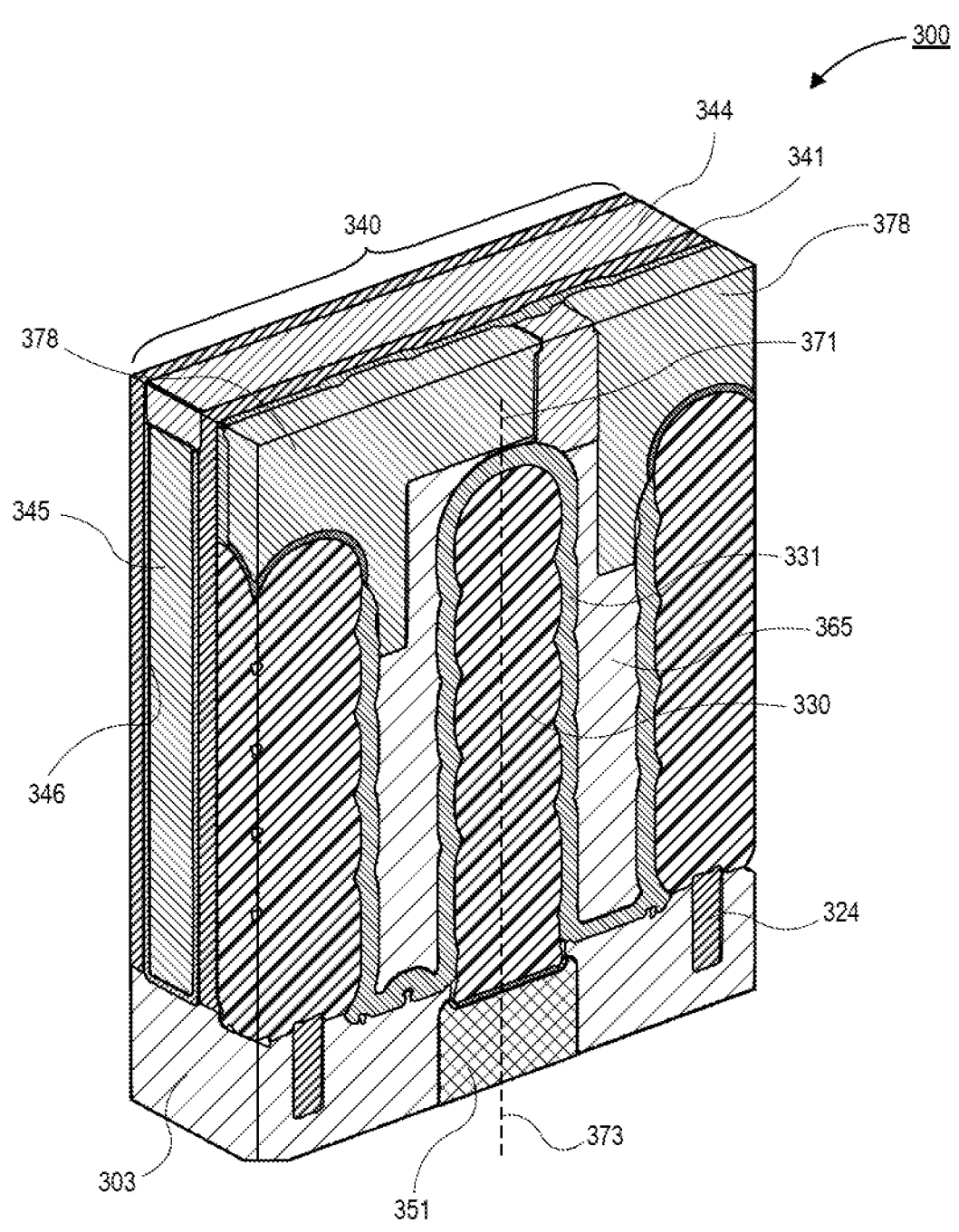
FIG. 3E is a perspective view illustration of the semiconductor device after the backside contact template is replaced with a metal contact, in accordance with an embodiment.

Referring now to FIG. 3E, a perspective view illustration of the semiconductor device 300 after the backside contact template 350 is replaced with a backside metal contact 373. In an embodiment, before replacing the backside contact template 350 with the backside metal contact 373, the gate structure 340 may be replaced. In other embodiments, the backside contact template 350 may be replaced before the gate structure 340 is replace. In an embodiment, a replacement metal gate process may be used to replace the gate structure 340. For example, the sacrificial gate 342 may be removed. The sacrificial layers 322 may also be removed from within the spacers 341. After removal of the sacrificial layers 322, a gate dielectric 346 may be deposited. After the gate dielectric 346 is deposited, a metal gate 345 may be disposed between the spacers 341. The metal gate 345 may comprise a workfunction metal and a fill metal. An insulating cap 344 may be provided over the metal gate 345.

The gate dielectric 346 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 346 to improve its quality when a high-k material is used.

When the metal gate 345 will serve as an N-type workfunction metal, the metal gate 345 preferably has a workfunction that is between about 3.9 eV and about 4.2 eV. N-type materials that may be used to form the metal gate 345 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the metal gate 345 will serve as a P-type workfunction metal, the metal gate 345 preferable has a workfunction that is between about 4.9 eV and about 5.2 eV. P-type materials that may be used to form the metal gate 345 include, but are not limited to, ruthenium, palladium, platinum, cobalt, nickel, and conductive metal oxides, e.g., ruthenium oxide.

After formation of the gate structure 340, the backside contact template 350 may be replaced. For example, the substrate 301 may be recessed to expose the backside contact template 350. The backside contact template 350 may then be etched out, and the backside metal contact 351 may be disposed in the cavity. For example, the backside metal contact 351 may comprise tungsten or the like. Since the cavity is self-aligned with the source/drain 330, a centerline 371 of the source/drain 330 will be substantially coincident with a centerline 373 of the backside metal contact 351. Accordingly, the pitch between fins can be reduced since there is not a chance of shorting a backside metal contact 351 to a neighboring source/drain 330. Additionally, embodiments may include forming front side contacts 378 to the source/drains adjacent to the source/drain 330 with the backside metal contact 351.

Figure 4:
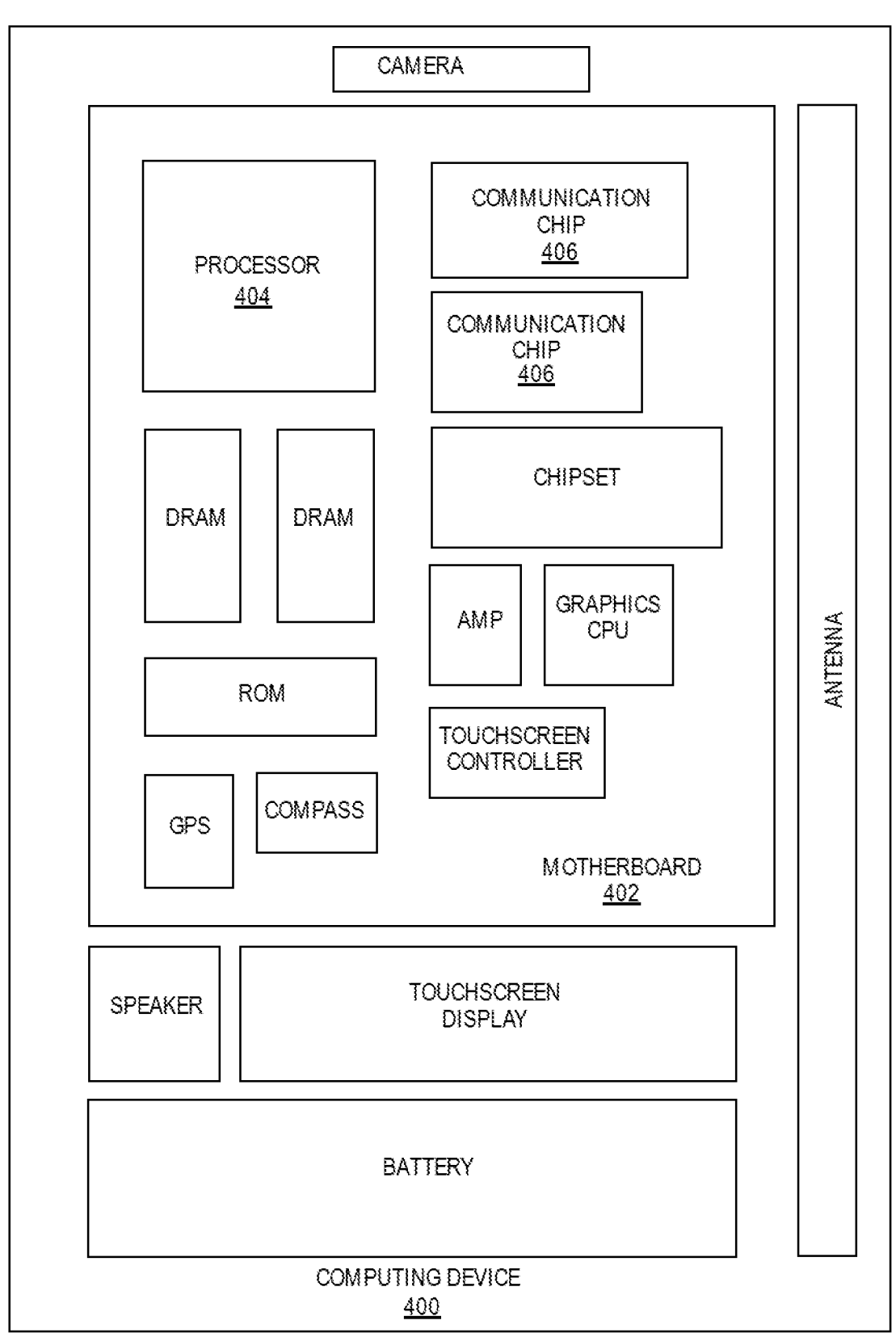
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404.

In an embodiment, the integrated circuit die of the processor may comprise a transistor device with a source that has a centerline that is substantially coincident with a centerline of a backside metal contact, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip may comprise a transistor device with a source that has a centerline that is substantially coincident with a centerline of a backside metal contact, as described herein.

In further implementations, another component housed within the computing device 400 may comprise a transistor device with a source that has a centerline that is substantially coincident with a centerline of a backside metal contact, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
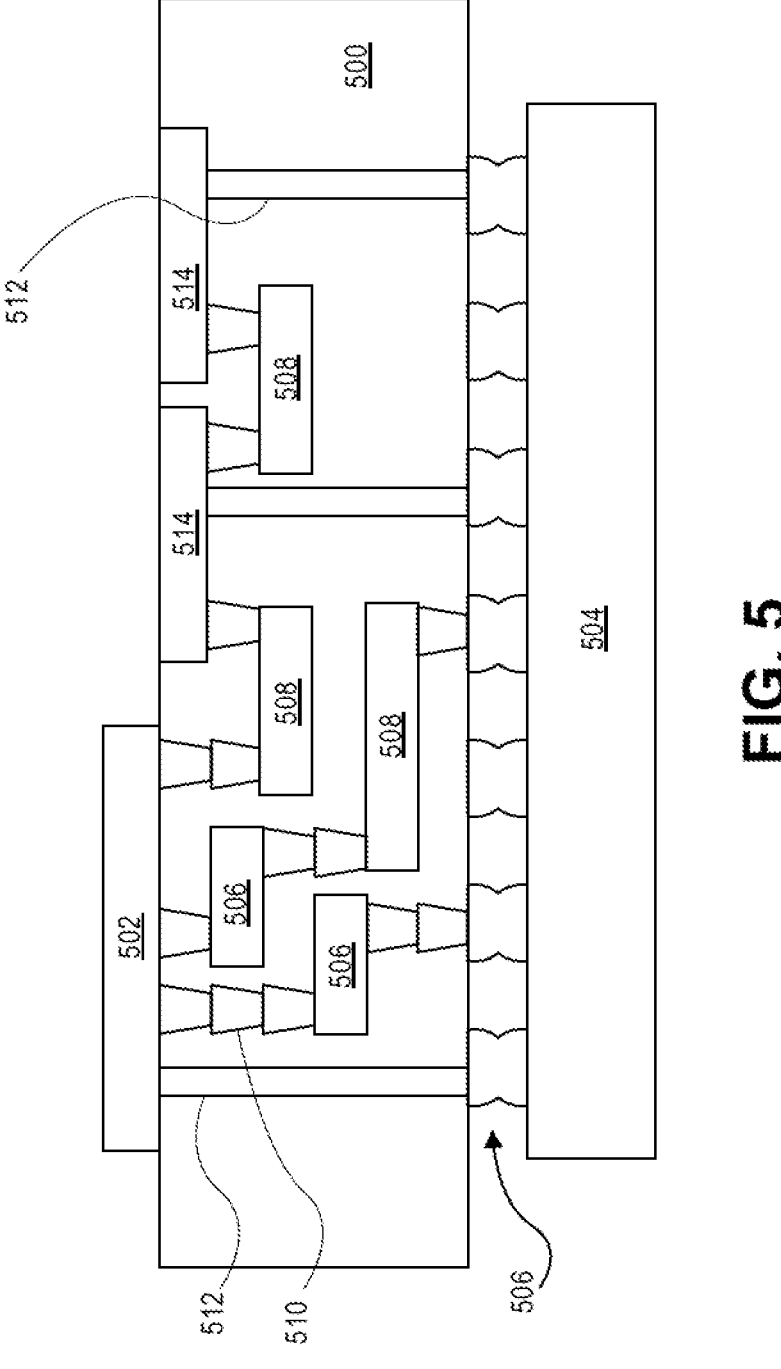
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. In an embodiment, one of both of the first substrate 502 and the second substrate 504 may comprise a transistor device with a source that has a centerline that is substantially coincident with a centerline of a backside metal contact, in accordance with embodiments described herein. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure may comprise a transistor device with a source that has a centerline that is substantially coincident with a centerline of a backside metal contact.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a vertical stack of semiconductor channels; a source on a first side of the vertical stack of semiconductor channels; a drain on a second side of the vertical stack of semiconductor channels; and a metal below the source and in direct contact with the source, wherein a centerline of the metal is substantially aligned with a centerline of the source.

Example 2: the semiconductor device of Example 1, wherein the semiconductor channels are nanowire or nanoribbon channels.

Example 3: the semiconductor device of Example 1 or Example 2, further comprising: a gate structure over and around the vertical stack of semiconductor channels.

Example 4: the semiconductor device of Examples 1-3, wherein a width of the metal is greater than a width of the source.

Example 5: the semiconductor device of Examples 1-3, wherein a width of the metal is substantially equal to a width of the source.

Example 6: the semiconductor device of Examples 1-5, further comprising: a dielectric over the source and the drain; and an oxide over the dielectric.

Example 7: the semiconductor device of Example 6, wherein the dielectric comprises silicon and nitrogen; silicon, carbon, and nitrogen; or silicon, oxygen, and nitrogen.

Example 8: the semiconductor device of Examples 1-7, wherein the metal comprises tungsten.

Example 9: the semiconductor device of Examples 1-8, wherein the source and the drain have scalloped sidewalls.

Example 10: the semiconductor device of Examples 1-9, wherein the source and the drain comprise an epitaxially grown semiconductor material.

Example 11: a method of forming an electronic device, comprising: forming a fin over a substrate, wherein the fin comprises alternating layers of channel material and sacrificial material; disposing a gate structure over the fin; recessing the fin outside of the gate structure;

forming an epitaxial barrier layer on opposite sides of the fin; forming a backside contact template at the bottom of the epitaxial barrier layer; epitaxially growing a source region between the epitaxial barrier layer; and replacing the backside contact template with a metal contact.

Example 12: the method of Example 11, wherein the backside contact template comprises polysilicon.

Example 13: the method of Example 11 or Example 12, further comprising: disposing a dielectric layer over the source region.

Example 14: the method of Example 13, wherein the dielectric layer comprises silicon and nitrogen; silicon, carbon and nitrogen; or silicon oxygen and nitrogen.

Example 15: the method of Examples 11-14, wherein a centerline of the metal contact is substantially aligned with a centerline of the source.

Example 16: the method of Examples 11-15, wherein a width of the metal contact is greater than a width of the source.

Example 17: the method of Examples 11-16, wherein a width of the metal contact is substantially equal to a width of the source.

Example 18: the method of Examples 11-17, wherein the gate structure comprises polysilicon.

Example 19: the method of Example 18, wherein the gate structure is replaced with a replacement metal gate structure after the source is formed.

Example 20: the method of Example 19, wherein the sacrificial material is removed before the replacement metal gate structure is formed.

Example 21: the method of Examples 11-20, wherein replacing the backside contact template with a metal contact, comprises: recessing a backside surface of the substrate to expose the backside contact template; removing the backside contact template to form a cavity below the source; and filling the cavity with the metal contact.

Example 22: the method of Examples 11-21, wherein the metal contact comprises tungsten.

Example 23: an electronic system, comprising: a board; a package substrate coupled to the board; and a die coupled to the package substrate, wherein the die comprises: a vertical stack of semiconductor channels; a source on a first side of the vertical stack of semiconductor channels; a drain on a second side of the vertical stack of semiconductor channels; and a metal below the source and in direct contact with the source, wherein a centerline of the metal is substantially aligned with a centerline of the source.

Example 24: the electronic system of Example 23, wherein a width of the metal is greater than a width of the source.

Example 25: the electronic system of Example 23, wherein a width of the metal is substantially equal to a width of the source.

What is claimed is:

1. A semiconductor device, comprising:
a vertical stack of semiconductor channels;
a source on a first side of the vertical stack of semiconductor channels;
a drain on a second side of the vertical stack of semiconductor channels; and
a metal below the source and in direct contact with the source, wherein a centerline of the metal is substantially aligned with a centerline of the source, wherein the metal has an uppermost surface below a bottom-most surface of the source, and wherein the metal has a lateral width across the centerline of the metal greater than a maximum lateral width of the source across the centerline of the source.

2. The semiconductor device of claim 1, wherein the semiconductor channels are nanowire or nanoribbon channels.

3. The semiconductor device of claim 1, further comprising:
a gate structure over and around the vertical stack of semiconductor channels.

4. The semiconductor device of claim 1, further comprising:
a dielectric over the source and the drain; and
an oxide over the dielectric.

5. The semiconductor device of claim 4, wherein the dielectric comprises silicon and nitrogen; silicon, carbon, and nitrogen; or silicon, oxygen, and nitrogen.

6. The semiconductor device of claim 1, wherein the metal comprises tungsten.

7. The semiconductor device of claim 1, wherein the source and the drain have scalloped sidewalls.

8. The semiconductor device of claim 1, wherein the source and the drain comprise an epitaxially grown semiconductor material.

9. A method of forming an electronic device, comprising:
forming a fin over a substrate, wherein the fin comprises alternating layers of channel material and sacrificial material;
disposing a gate structure over the fin;
recessing the fin outside of the gate structure;
forming an epitaxial barrier layer on opposite sides of the fin;
forming a backside contact template at the bottom of the epitaxial barrier layer;
epitaxially growing a source region between the epitaxial barrier layer; and
replacing the backside contact template with a metal contact, wherein a centerline of the metal contact is substantially aligned with a centerline of the source region, wherein the metal contact has an uppermost surface below a bottommost surface of the source region, and wherein the metal contact has a lateral width across a centerline of the metal greater than a maximum lateral width of the source across a centerline of the source.

10. The method of claim 9, wherein the backside contact template comprises polysilicon.

11. The method of claim 9, further comprising:
disposing a dielectric layer over the source region.

12. The method of claim 11, wherein the dielectric layer comprises silicon and nitrogen; silicon, carbon and nitrogen; or silicon oxygen and nitrogen.

13. The method of claim 9, wherein the gate structure comprises polysilicon.

14. The method of claim 13, wherein the gate structure is replaced with a replacement metal gate structure after the source is formed.

15. The method of claim 14, wherein the sacrificial material is removed before the replacement metal gate structure is formed.

16. The method of claim 9, wherein replacing the backside contact template with a metal contact, comprises:
recessing a backside surface of the substrate to expose the backside contact template;

removing the backside contact template to form a cavity below the source; and filling the cavity with the metal contact.

17. The method of claim 9, wherein the metal contact comprises tungsten.

18. An electronic system, comprising:

a board;

a package substrate coupled to the board; and a die coupled to the package substrate, wherein the die comprises:

a vertical stack of semiconductor channels;

a source on a first side of the vertical stack of semiconductor channels;

a drain on a second side of the vertical stack of semiconductor channels; and a metal below the source and in direct contact with the source, wherein a centerline of the metal is substantially aligned with a centerline of the source, wherein the metal has an uppermost surface below a bottommost surface of the source, and wherein the metal has a lateral width across the centerline of the metal greater than a maximum lateral width of the source across the centerline of the source.

* * * * *